(12) United States Patent
Blasiak et al.

(10) Patent No.: US 8,338,082 B2
(45) Date of Patent: Dec. 25, 2012

(54) DI WATER RINSE OF PHOTORESISTS WITH INSOLUBLE DYE CONTENT

(75) Inventors: Maciej Blasiak, Plano, TX (US); Sean Trautman, Allen, TX (US); Jerry Schlesinger, Denton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 983 days.

(21) Appl. No.: 12/058,056

(22) Filed: Mar. 28, 2008

(65) Prior Publication Data
US 2009/0246705 A1    Oct. 1, 2009

(51) Int. Cl.
G03F 7/26    (2006.01)

(52) U.S. Cl. ...................... 430/311; 430/331

(58) Field of Classification Search ............... 430/311, 430/322, 331
See application file for complete search history.

(56) References Cited

U.S. PATENT DOCUMENTS

| | | | |
|---|---|---|---|
| 3,833,374 A * | 9/1974 | Patrick | 430/293 |
| 4,411,973 A * | 10/1983 | Gilmour et al. | 430/7 |
| 2002/0001781 A1 * | 1/2002 | Ema et al. | 430/329 |
| 2005/0139242 A1 * | 6/2005 | Nam | 134/103.1 |

* cited by examiner

Primary Examiner — Kathleen Duda
(74) Attorney, Agent, or Firm — Wade J. Brady, III; Frederick J. Telecky, Jr.; Jacqueline J. Garner

(57) ABSTRACT

A method of forming a pattern in a photoresist layer which contains a dye that is insoluble in the developer solution is disclosed. A rinse liquid, typically deionized water, is dispensed onto the substrate while it is rotated at less than 750 rpm. The dye in the exposed regions is carried off by the rinse liquid, and does not accumulate in corners of exposed regions at the edge of the substrate due to centrifugal action.

5 Claims, 9 Drawing Sheets

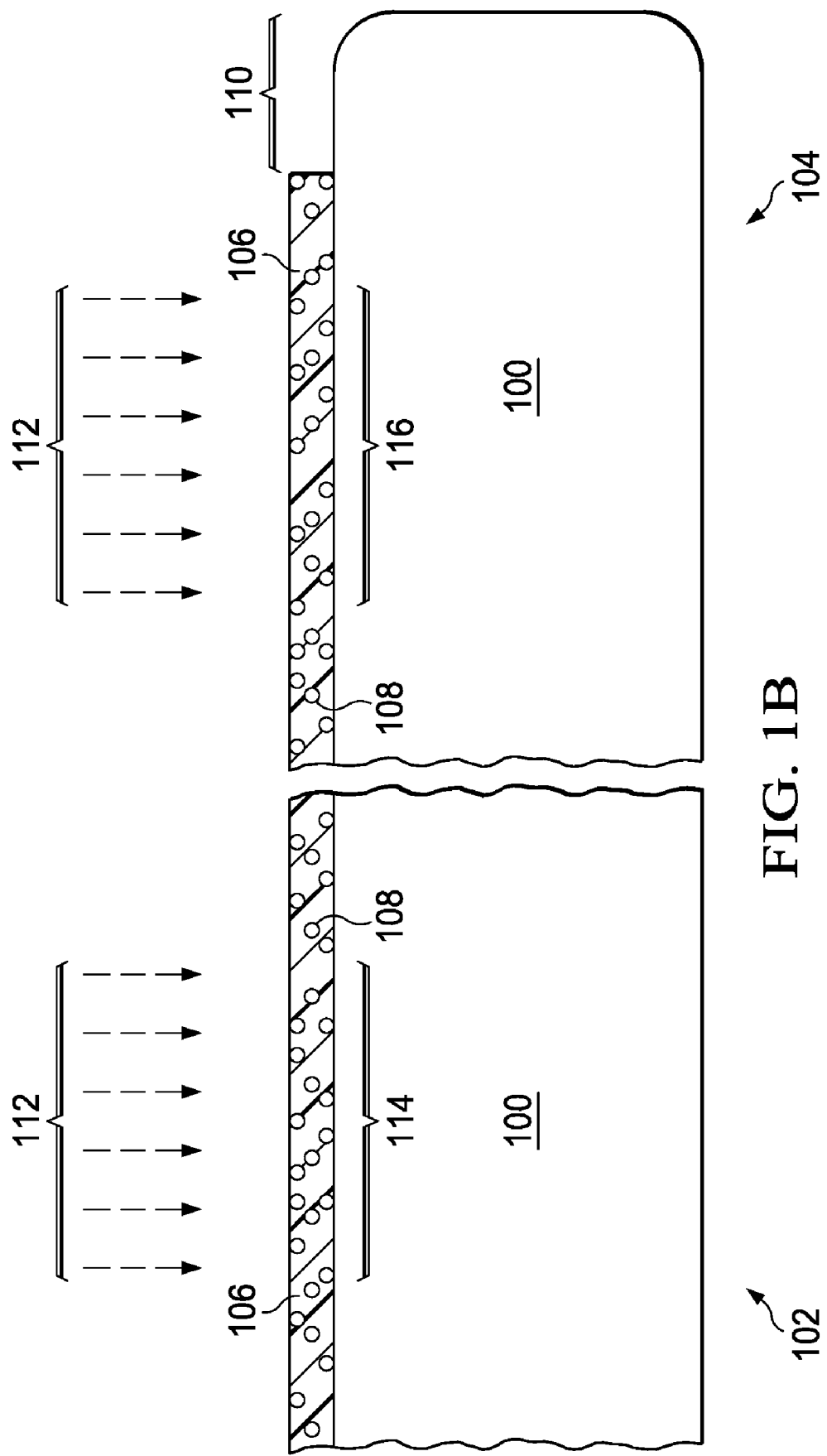

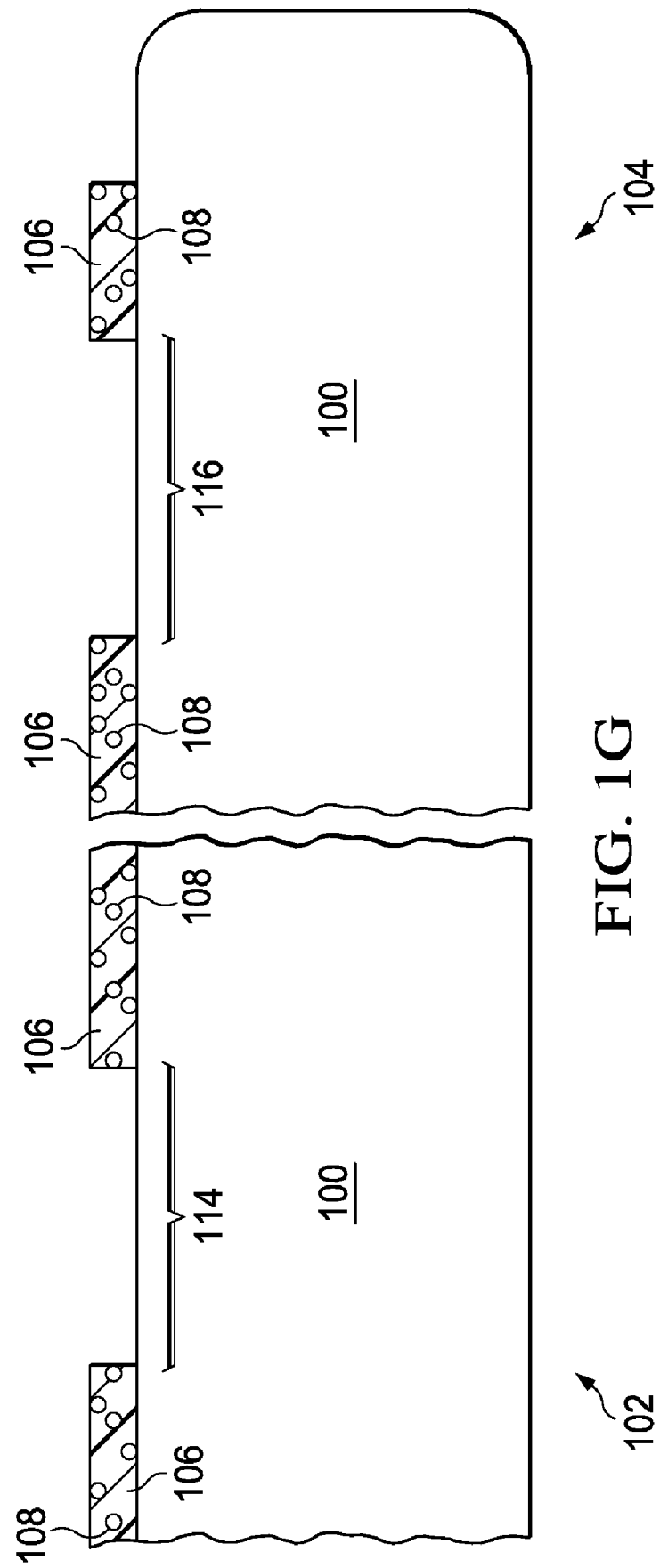

DI WATER RINSE OF PHOTORESISTS WITH INSOLUBLE DYE CONTENT

FIELD OF THE INVENTION

This invention relates to the field of integrated circuits. More particularly, this invention relates to methods to improve photoresist patterns.

BACKGROUND OF THE INVENTION

It is well known that lateral dimensions of features in components in complementary metal oxide semiconductor (CMOS) integrated circuits (ICs) are shrinking with each new fabrication technology node, as articulated by Moore's Law. Definition of features in ICs requires forming photoresist patterns on the surfaces of the ICs with appropriate lateral dimensions. One challenge in forming these photoresist patterns is to control reflections of the exposure UV light in the photoresist layer to maintain control of the lateral dimensions of the features being formed. One common method of controlling reflections in photoresist is to mix a dye, which absorbs at the wavelength of the exposure UV light, in the photoresist. Some dyes used for this purpose are not soluble in the developer solution or in liquid used for a rinse operation, typically water, after developing the photoresist pattern. Dye molecules in a region of photoresist that is removed by the developer solution may undesirably remain on the surface of the IC, forming dye residue, and causing problems with subsequent process steps. Moreover, dye molecules in photoresist regions adjacent to developed areas may leach into the developed areas during the rinse operation, further exacerbating the problem of dye residue in the developed areas.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a method of forming a pattern in a photoresist layer on a substrate which contains a dye that is insoluble in the developer solution. After the develop process operation, a rinse operation is performed in which a rinse liquid, typically deionized water, is dispensed onto the substrate while it is rotated at less than 750 rpm. The dye in the exposed regions is carried off by the rinse liquid, and does not accumulate in corners of exposed regions at the edge of the substrate due to centrifugal action.

An advantage of the invention is providing a method of forming a photoresist pattern that reduces or eliminates dye residue.

DESCRIPTION OF THE VIEWS OF THE DRAWING

FIG. 1A through FIG. 1G are cross-sections of a region near the center of a wafer and a region at an edge of the same wafer during a photolithographic process sequence embodying the instant invention.

DETAILED DESCRIPTION

Figure 1A:
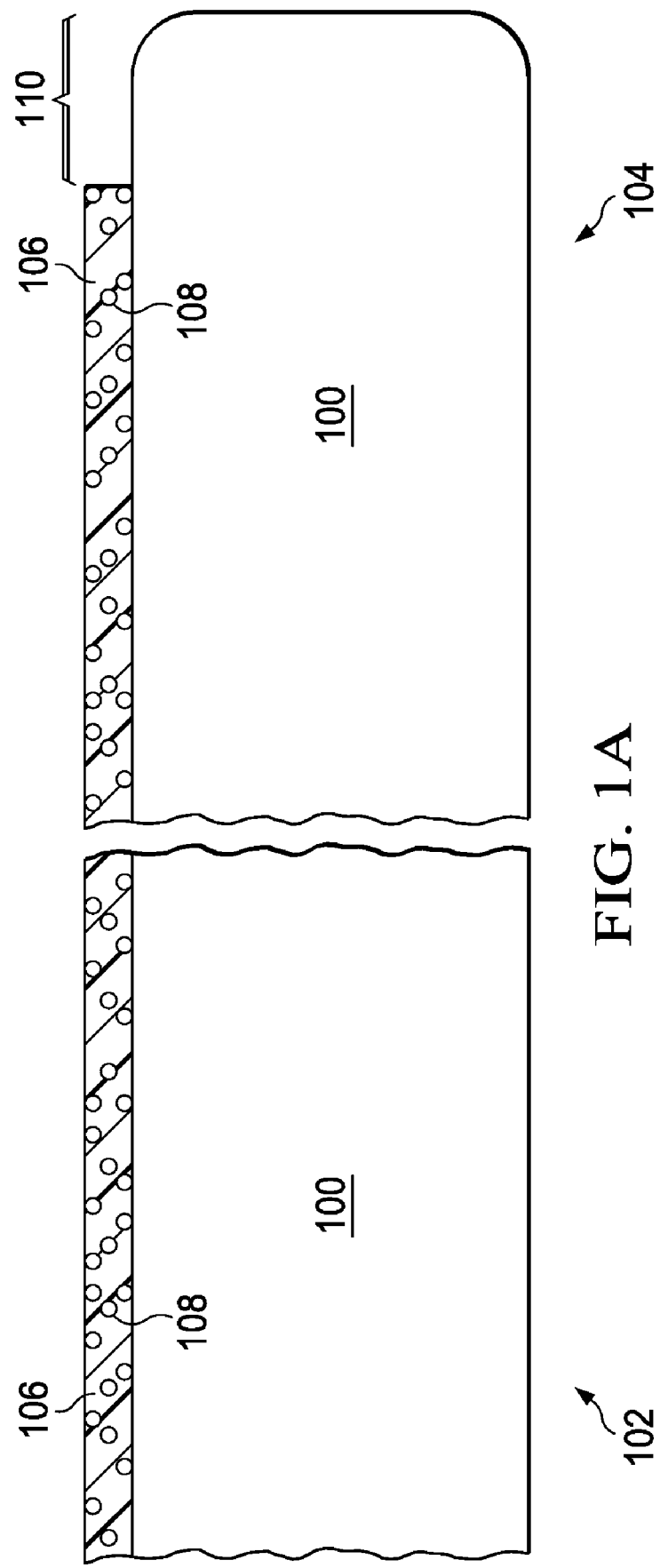

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for a photolithographic process that is free of dye residue is addressed by the instant invention, which provides a method of performing a rinse process operation of a photoresist pattern on a substrate, typically a wafer, which removes substantially all dye from developed regions of the photoresist pattern.

FIG. 1A through FIG. 1G are cross-sections of a region near the center of a wafer and a region at an edge of the same wafer during a photolithographic process sequence embodying the instant invention. FIG. 1A depicts a wafer (100) in cross-section, including a region near the center of the wafer (102) and a region at an edge of the wafer (104). A layer of photoresist (106) is deposited on a top surface of the wafer (100), typically by dispensing the photoresist onto the top surface at the center of the wafer, followed by spinning the wafer (100) to distribute the photoresist across the top surface of the wafer and attain a desired thickness of the photoresist layer (106). The photoresist layer (106) contains dye molecules (108) dispersed throughout the photoresist layer (106). Photoresist (106) is typically removed from a wafer edge exclusion region (110) to reduce defects during IC fabrication.

FIG. 1B depicts the wafer (100) during a subsequent process step, in which the photoresist layer (106) is irradiated by exposure UV light (112) in regions defined by a photomask in photolithographic equipment. Exposure is typically performed by a wafer exposure tool, which exposes the photoresist in discrete regions, commonly called shots, in sequential order to cover the top surface of the wafer (100). In each shot, some regions of the photoresist layer (106) are irradiated by the exposure UV light (112) and some regions are not irradiated. In FIG. 1B, a first exposed region (114) in the near center region (102) of the wafer (100) and a second exposed region (116) in the edge region (104) of the wafer (100) are irradiated by the exposure UV light (112). During the exposure process step, UV light absorbed by the photoresist (106) converts functional groups on photoresist molecules to a type that is soluble in a developer solution. The dye molecules (108) in the photoresist regions adjacent to the first and second exposed regions (114, 116) absorb reflected exposure UV light and thus reduce undesired enlargement of the exposed regions.

Figure 1C:
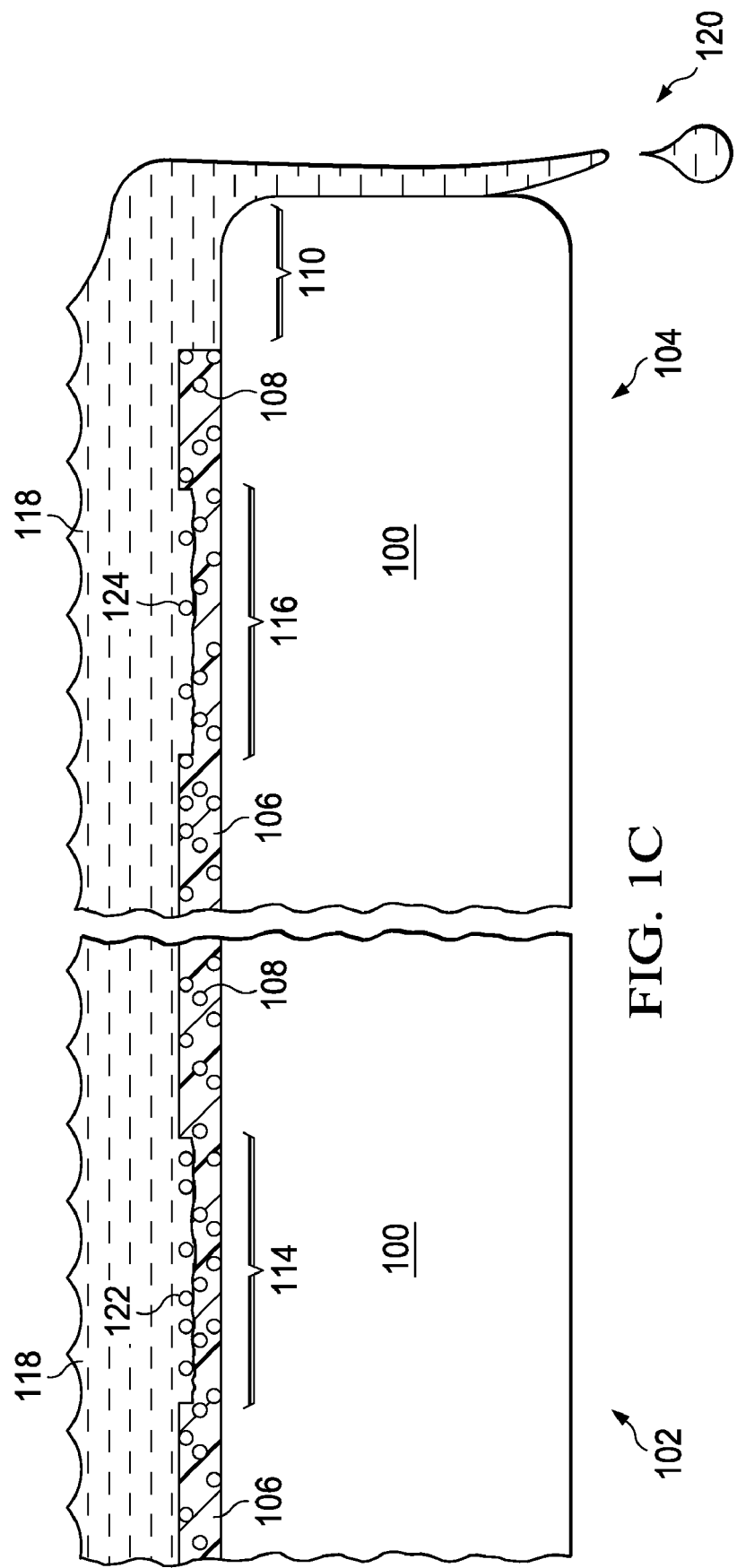

FIG. 1C depicts the wafer (100) during a develop process operation, shortly after application of a developer solution (118) to the photoresist layer (106). The developer solution (118) is typically an alkaline aqueous solution such as tetra methyl ammonium hydroxide (TMAH) in water. The developer solution (118) is dispensed onto a top surface of the photoresist layer (106) at the center of the wafer (100) and flows across the top surface of the photoresist layer (106) to the edge of the wafer, where used developer solution (120) falls from the edge of the wafer (100). As the developer solution (118) flows across the top surface of the photoresist layer (106), photoresist molecules in exposed regions (114, 116) are dissolved into the developer solution (118) and carried off the wafer in the used developer solution (120). Dye molecules (122) that were in the photoresist in the first exposed region (114) near the center of the wafer (100) and dye molecules (124) that were in the photoresist in the second exposed region (116) near the edge of the wafer (100) are insoluble in the developer solution (118) and remain in the exposed regions (114, 116).

Figure 1D:
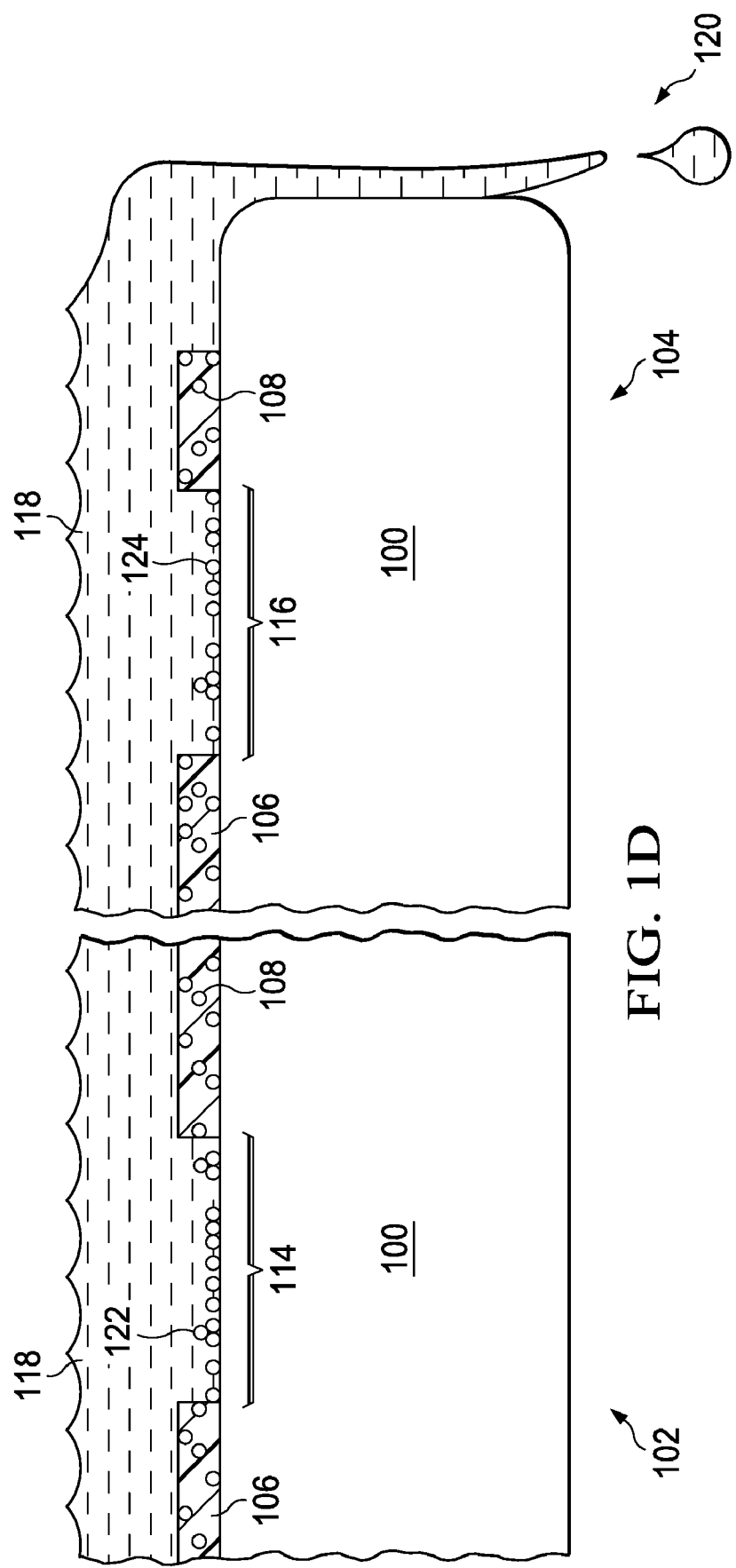

FIG. 1D depicts the wafer (100) during the develop process operation, at a point in time when the photoresist in the exposed regions (114, 116) has been dissolved into the developer solution. Dye molecules (122) that were in the photoresist in the first exposed region (114) near the center of the wafer (100) and dye molecules (124) that were in the photoresist in the second exposed region (116) near the edge of the wafer (100) are insoluble in the developer solution (118) and remain in the exposed regions (114, 116) on the top surface of the wafer (100). The develop process operation is followed by a rinse process operation.

Figure 1E:
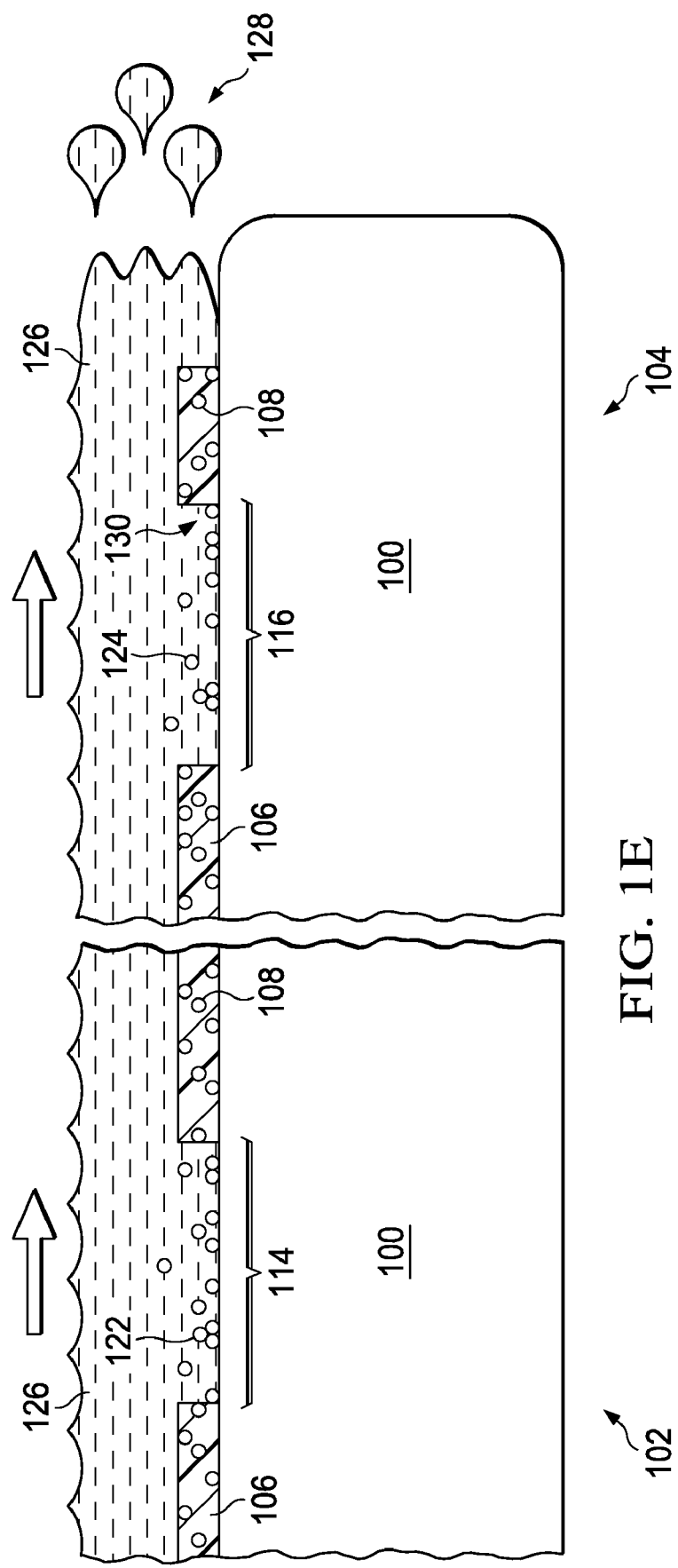

FIG. 1E depicts the wafer (100) during a rinse process operation, shortly after starting to dispense a rinse liquid (126), typically deionized water (DIW), onto the top surface of the photoresist layer (106). The rinse liquid (126) is dispensed at a rate of 300 to 3000 cc/minute (cubic centimeters/minute) onto the top surface of the photoresist layer (106) at the center of the wafer (100). The wafer (100) is spun at a spin rate below 750 rpm, which produces a radial flow pattern in the rinse liquid (126) such that the rinse liquid (126) has a higher flow speed in the edge region (104) than the region (102) near the center of the wafer (100). Rinse liquid (128) reaching the edge of the wafer (100) flies from the wafer, commonly in the form of liquid droplets. During the rinse process operation, dye molecules (122, 124) on the top surface of the wafer (100) in the exposed regions (114, 116) are picked up and carried by the motion of the rinse liquid (126) from the top surface of the wafer (100). Rotating the wafer at a spin speed below 750 rpm eliminates a tendency for the dye molecules (124) at the edge region of the wafer to collect in a region (130) adjacent to a leading edge of the photoresist layer (106), due to centrifugal action. In a preferred embodiment, the wafer is spun at 500 rpm.

Figure 1F:
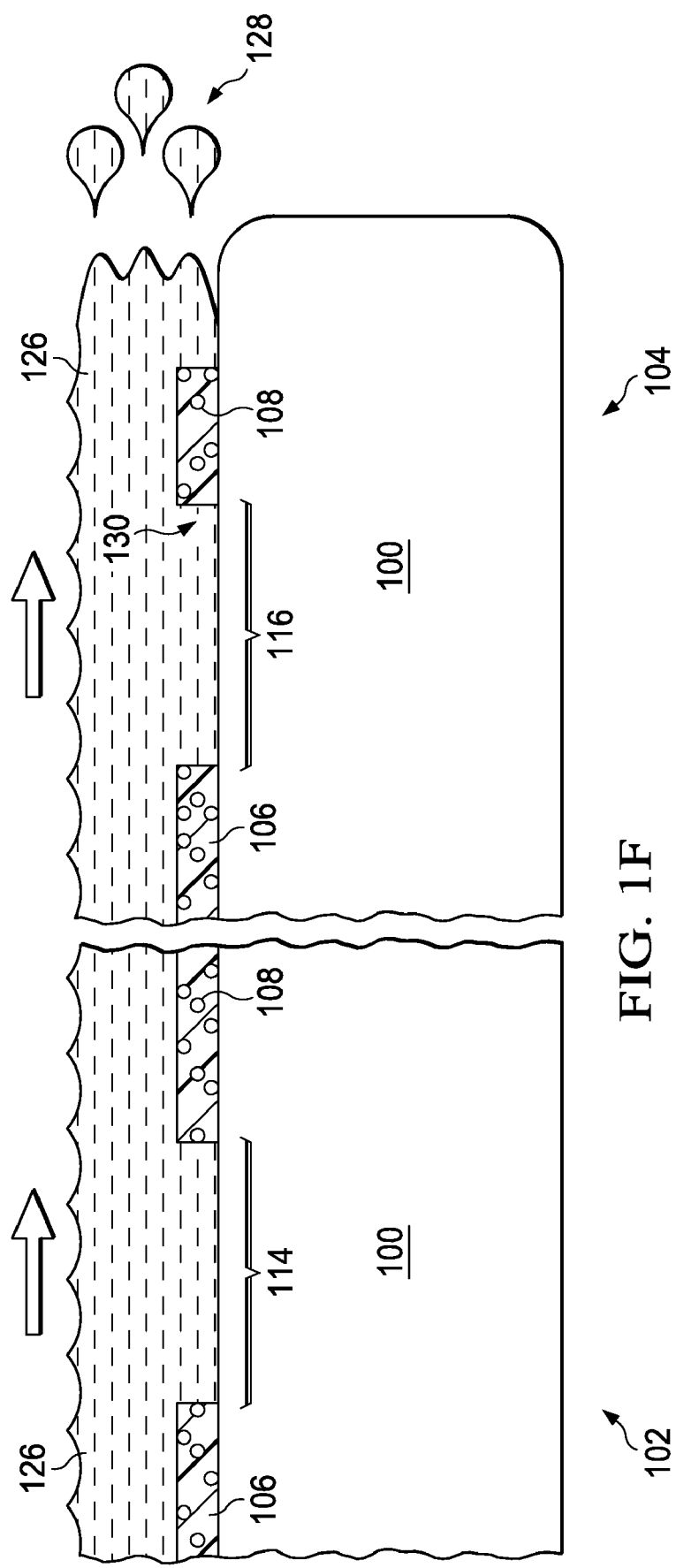

FIG. 1F depicts the wafer (100) near the completion of the rinse process operation. There may be dye molecules from the photoresist (106) adjacent to the exposed regions (114, 116) that diffuse into the exposed regions (114, 116). These dye molecules are also picked up and carried by the motion of the rinse liquid (126) from the top surface of the wafer (100). The rinse liquid is typically dispensed for 10 to 300 seconds. At the completion of the rinse process operation, there are substantially no dye molecules remaining in the exposed regions (114, 116). This is advantageous because dye molecules in an exposed region can interfere with subsequent process operations such as etching or shallow ion implantation. The rinse process operation is followed by a drying process operation.

FIG. 1G depicts the wafer (100) after the drying process operation. During the drying process operation, the wafer (100) is spun at high speed to remove all rinse liquid from the wafer.

Figure 2:
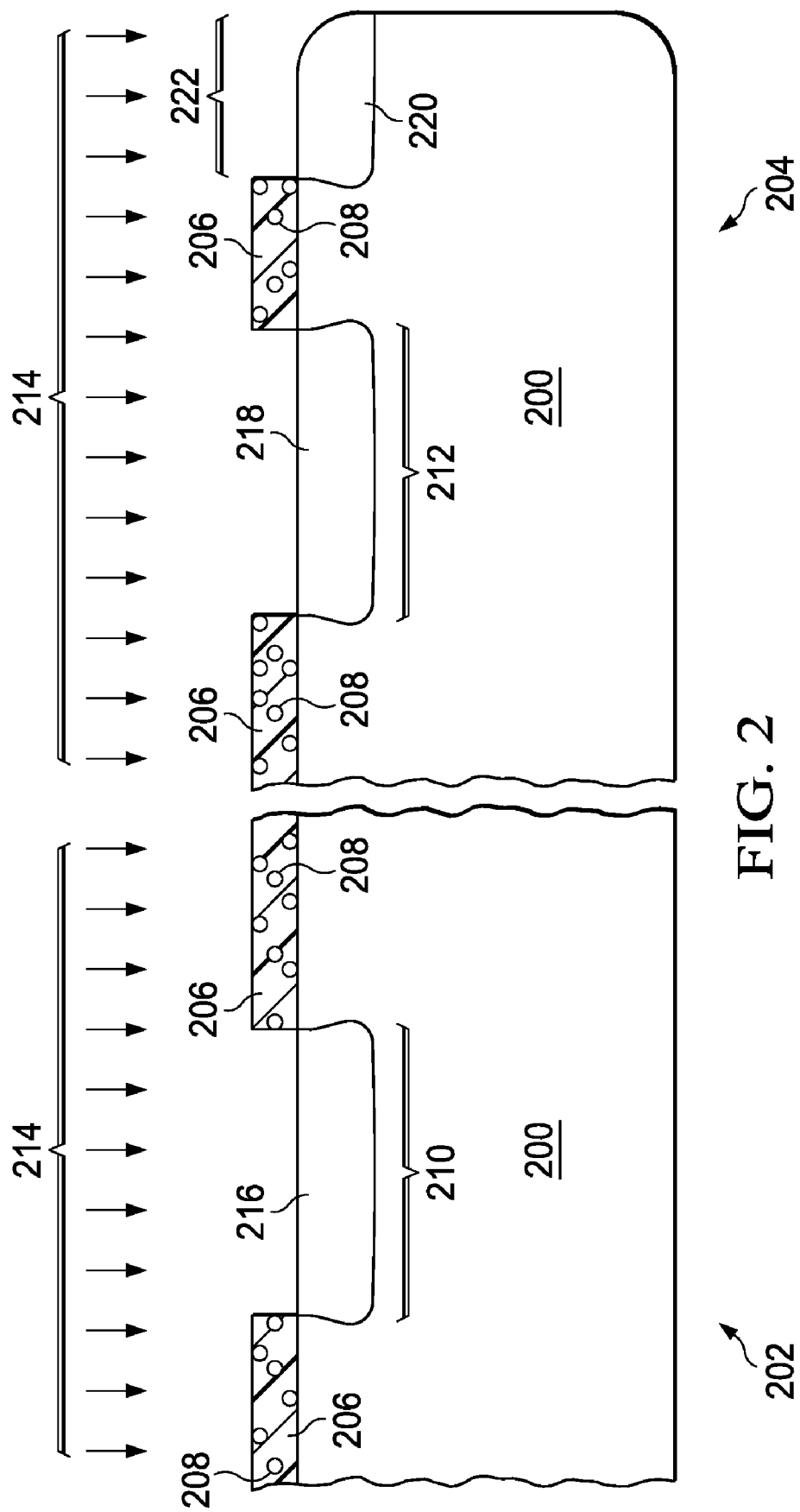
FIG. 2 depicts a wafer patterned according to the instant invention during an ion implantation process.

FIG. 2 depicts a wafer patterned according to the instant invention during an ion implantation process. The wafer (200), shown in cross-section, includes a near center region (202) near the center of the wafer (200) and an edge region (204) at an edge of the wafer (200). A photoresist layer (206) including dye molecules (208) is patterned according to the instant invention to form a first exposed region (210) in the near center region (202) of the wafer (200) and a second exposed region (212) in the edge region (204) of the wafer (200). An implanted species (214) is ion implanted into the photoresist layer (206) and exposed regions (210, 212) to form a first implanted region (216) in the near center region (202) and a second implanted region (218) in the edge region (204). A rim implanted region (220) in a wafer edge exclusion region (222) is also formed. The implanted species may include dopant atoms such as boron, phosphorus, gallium, arsenic, indium, and/or antimony, or non-dopant atoms such as silicon, germanium, carbon and/or argon. Removal of dye molecules from the exposed regions (210, 212) is advantageous because atoms of the implanted species (214) in the implanted regions (216, 218) are desirably uniformly distributed across their widths, which would not be the case if dye molecule residue were present in the exposed regions (210, 212).

Figure 3:
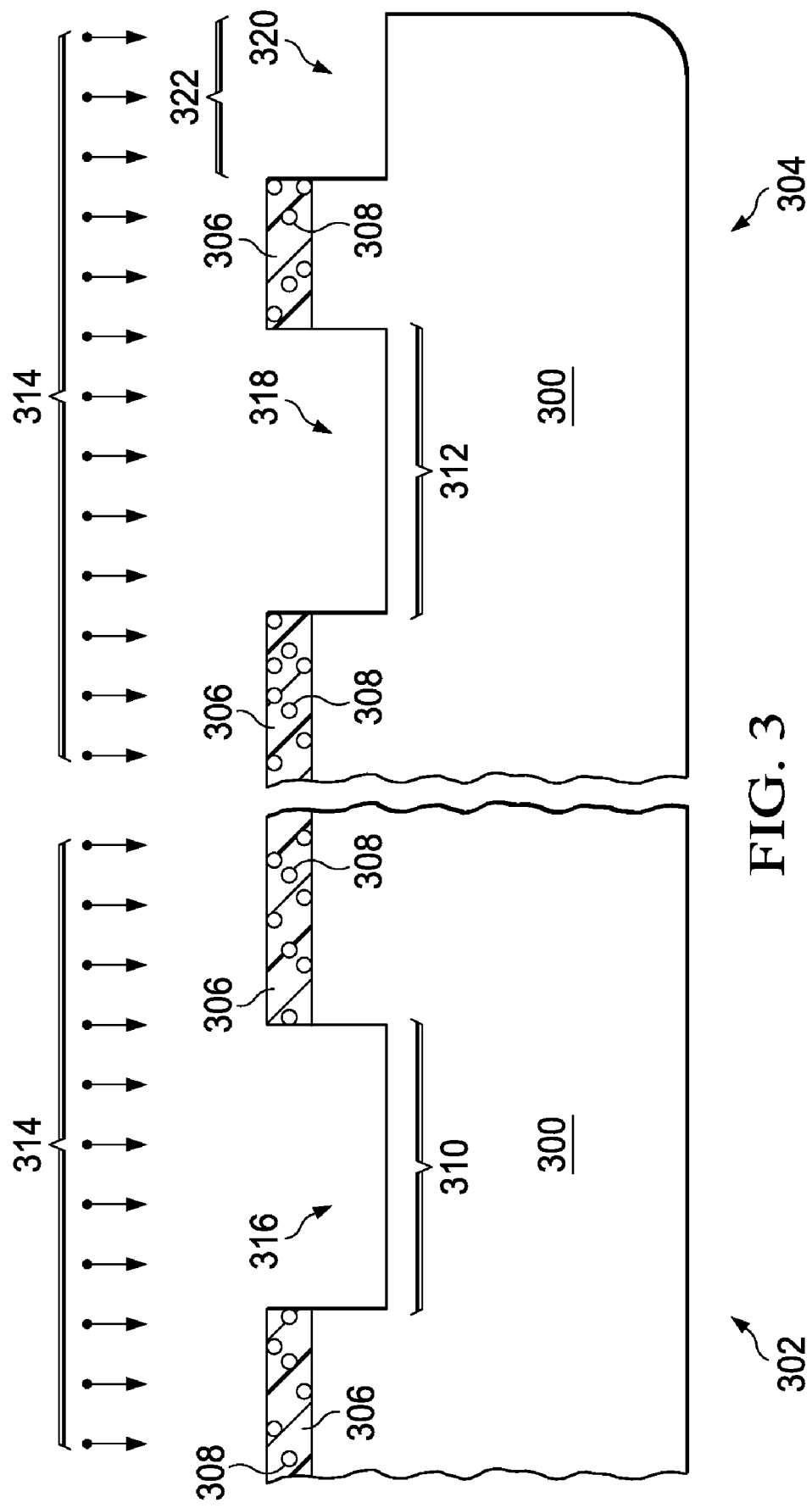
FIG. 3 depicts a wafer patterned according to the instant invention during an etch process.

FIG. 3 depicts a wafer patterned according to the instant invention during an etch process. The wafer (300), shown in cross-section, includes a near center region (302) near the center of the wafer (300) and an edge region (304) at an edge of the wafer (300). A photoresist layer (306) including dye molecules (308) is patterned according to the instant invention to form a first exposed region (310) in the near center region (302) of the wafer (300) and a second exposed region (312) in the edge region (304) of the wafer (300). An etchant species (314) impinges on the photoresist layer (306) and exposed regions (310, 312) to form a first etched region (316) in the near center region (302) and a second etched region (318) in the edge region (304). A rim etched region (320) in a wafer edge exclusion region (322) is also formed. The etchant species (314) may include fluorine, chlorine, and/or or molecules containing fluorine and/or chlorine. Removal of dye molecules from the exposed regions (310, 312) is advantageous because the etched regions (316, 318) are desirably uniformly deep across their widths, which would not be the case if dye molecule residue were present in the exposed regions (310, 312).

What is claimed is:

1. A method of fabricating an integrated circuit comprising the steps of:
   depositing a photoresist film having a plurality of dye molecules embedded therein on a surface of a semiconductor wafer having a diameter of approximately 300 mm;
   exposing a region of the photoresist film to UV light;
   applying a developer solution to remove a portion of the photoresist film leaving an exposed region, wherein a subset of the plurality of dye molecules remain in the exposed region;
   removing the subset of the plurality of dye molecules from the exposed region by dispensing a rinsing liquid on the surface of the semiconductor wafer while spinning said semiconductor wafer at a lower speed to create a radial flow pattern in the rinse liquid such that the rinse liquid has a higher flow speed in an edge region of the semiconductor wafer than in a center region of the semiconductor wafer and to prevent dye molecules from collecting at an edge of the photoresist film; and
   drying the semiconductor wafer by spinning the semiconductor wafer at a higher speed to remove the rinse liquid from the surface.

2. The method of claim 1, wherein said lower speed is approximately 500 rpm.

3. The method of claim 1, wherein said step of dispensing a rinse liquid further comprises the condition of dispensing said rinse liquid at 300 to 3000 cc/minute.

4. The method of claim 1, in which said step of dispensing a rinse liquid is performed from 10 to 300 seconds.

5. The method of claim 1 wherein said rinsing liquid comprises deionized water.

* * * * *